United States Patent
Shi et al.

(10) Patent No.: US 7,405,473 B1
(45) Date of Patent: Jul. 29, 2008

(54) TECHNIQUES FOR OPTIMIZING ELECTRICAL PERFORMANCE AND LAYOUT EFFICIENCY IN CONNECTORS WITH VIA PLACEMENT AND ROUTING

(75) Inventors: Hong Shi, Santa Clara, CA (US); Yuanlin John Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 204 days.

(21) Appl. No.: 11/285,912

(22) Filed: Nov. 23, 2005

(51) Int. Cl.
*H01L 23/04* (2006.01)
*H05K 1/11* (2006.01)

(52) U.S. Cl. .................. 257/698; 257/773; 257/776; 257/E23.011; 257/E23.067; 257/E23.145; 174/262; 361/788; 361/775; 361/791; 361/794; 361/795

(58) Field of Classification Search ............... 257/698, 257/773, 774, 776, E23.011, E23.067, E23.145; 174/26, 262; 361/788, 775, 794, 791, 795
See application file for complete search history.

(56) References Cited

U.S. PATENT DOCUMENTS 7,239,526 B1 * 7/2007 Bibee .................... 361/788
2006/0267048 A1 * 11/2006 Chen et al. ............. 257/208

* cited by examiner

*Primary Examiner*—Jasmine J Clark
(74) *Attorney, Agent, or Firm*—Steven J. Cahill

(57) ABSTRACT

Techniques are provided for placing and routing vias that conduct signals through a connector between two electrical units. Vias that conduct a first set of signals are placed next to vias that provide return paths for the first set of signals to reduce cross-talk or impedance. Vias that conduct input or output signals can be placed next to vias that provide return paths for the input or output signals to reduce cross-talk. The vias that provide the return paths can conduct, for example, ground signals, power supply signals, or both. Vias that conduct power supply signals can be placed next to vias that provide return paths for the power supply signals to reduce impedance. The vias that provide the return paths for the power supply signals can conduct, for example, ground signals. The via configurations reduce cost and increase yield, and the via configurations are modular.

24 Claims, 5 Drawing Sheets

TECHNIQUES FOR OPTIMIZING ELECTRICAL PERFORMANCE AND LAYOUT EFFICIENCY IN CONNECTORS WITH VIA PLACEMENT AND ROUTING

BACKGROUND OF THE INVENTION

1. Field of the Invention

The present invention relates to via placement and routing, and more particularly to techniques for via placement and routing that optimize electrical performance and layout efficiency.

2. Description of Related Art

An integrated circuit (IC) is a fragile piece of semiconductor that is easily damaged. Therefore, an IC is typically placed inside a package designed to protect the IC from damage that can occur during handling. An IC package is also designed to connect an IC to a printed circuit board (PCB) or other type of circuit board.

The pin connections on a PCB are usually much more widely spaced than the pins on an integrated circuit die. For this reason, a PCB cannot be directly connected to an integrated circuit die. Because the pins on an IC are densely packed together, a package spreads out signal wires routed from the IC pins so that they can be coupled to more widely spaced connections on a PCB. Thus, a package is a connector that provides an intermediate connectivity layer between an IC die and a circuit board.

A package typically contains a set of dielectric layers (including a core layer) and a set of conductive layers. Vias (i.e., holes) are bored through the layers of a package and filled with a conductive material. Signals such as a power supply voltage ($V_{DD}$), ground, input signals, and output signals are routed through the vias between the IC pins and the PCB connections.

The vias in a package that route the supply voltage connections to an IC are part of a power distribution network (also called a power network). The vias in a package that route the ground connections to an IC are part of a ground network. The vias in a package that route the input and output signals to and from the IC are part of an IO network.

Vias are typically placed individually within a package without regard to the relationships between networks. Ground vias are often placed, for example, at a 1-2 mm pitch opportunistically without any regard to their relationship to the IO network. Power supply vias are not routed in any relationship with respect to ground vias.

An IO network in a package often suffers from cross-talk. Cross-talk is interference that is caused by mutual capacitance and/or mutual inductive coupling between two adjacent IO vias (or wires). Cross-talk can cause the transmitted information to become distorted, possibly causing a partial or total loss of data. Cross-talk becomes more significant as the spacing between IO vias is reduced. One way to reduce cross-talk in a package is to decrease the thickness of the core layer to cut back on the mutual inductance.

A power network in a package often contains a significant amount of impedance. Impedance can cause problems in a power network. Impedance in a package causes a voltage drop in the power supply that can adversely affect circuit performance. For example, a significant voltage drop in the power supply voltage can effect circuit timing and/or slow down circuit operation in the IC significantly.

Therefore, it would be desirable to provide techniques for reducing cross-talk and impedance in vias that route signals through connectors.

BRIEF SUMMARY OF THE INVENTION

The present invention provides techniques for placing and routing vias that conduct signals through a connector between two electrical units. Via configurations of the present invention improve efficiency and consistency in routing and fabricating connectors. According to the present invention, vias that conduct a first set of signals in a connector are placed next to vias that provide return paths for the first set of signals to reduce cross-talk or impedance.

According to some embodiments, vias that conduct noisy signals are placed next to vias that provide return paths for the noisy signals to reduce cross-talk. For example, vias that conduct input and output signals can be placed next to vias that conduct ground signals, power supply signals, or both. According to other embodiments, vias that conduct power supply signals are placed next to vias that provide return paths for the power supply signals to reduce impedance. The vias that provide the return paths for the power supply signals can conduct, for example, ground signals.

The via configurations of the present invention reduce cost and increase yield, because they are independent (or weakly dependent) on the thickness of the connector. Also, the via configurations are modular, because they can be duplicated throughout a connector, while preserving the features and the performance of each individual via configuration. Because the via configurations are modular, the time and effort required to design and place a via layout can be reduced significantly.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
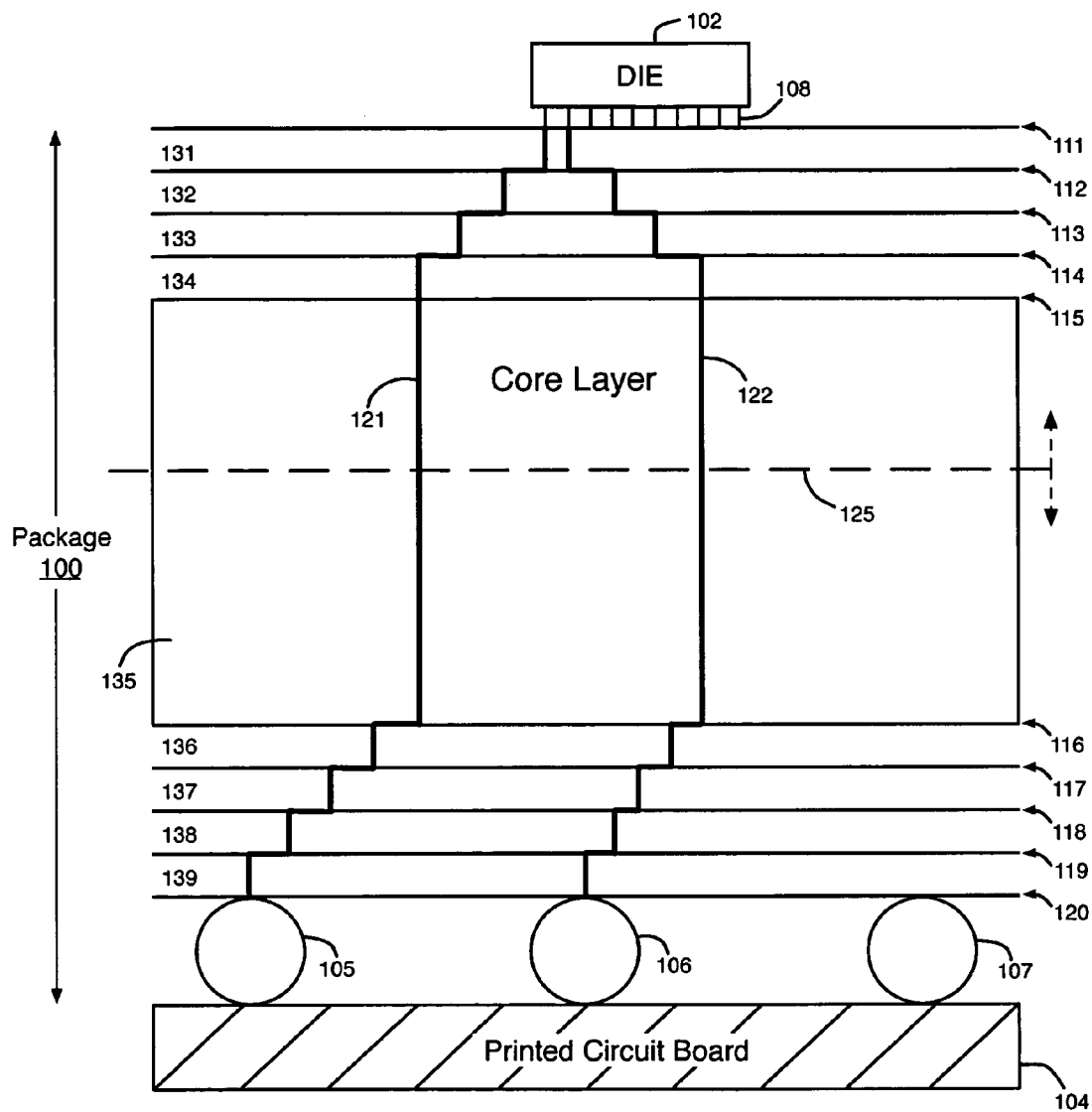
FIG. 1 illustrates an example of a package that can contain via configurations according to embodiments of the present invention.

FIG. 1 illustrates an example of a package 100 that can contain one or more via configurations of the present invention. Package 100 can be any desired thickness (e.g., 800 microns). Package 100 contains ten conductive layers 111-120 and nine dielectric layers 131-139. Each of the dielectric layers 131-139 lies between two of the conductive layers 111-120.

Core layer 135 is a dielectric layer situated between conductive layers 115 and 116. Package 100 is coupled to the die 102 of an integrated circuit (IC) through interconnect bumps 108. Die 102 can be any type of integrated circuit, for example, an application specific integrated circuit (ASIC) or a field programmable gate array (FPGA). Package 100 is also coupled to a printed circuit board (PCB) 104 through solder balls 105-107.

Package 100 contains several vias that are filled with conductive material. The vias can be plated through hole vias or any other type of vias. The vias connect the interconnect bumps 108 of die 102 to the solder balls, such as solder balls 105-107. Two exemplary vias 121-122 are shown in FIG. 1 for purposes of illustration. Via 121 connects one of bumps 108 to solder ball 105, and via 122 connects another one of bumps 108 to solder ball 106. The portion of a via passing through each layer is generally vertical. However, the vias can stagger between the layers as shown in FIG. 1 so that the vias can make connections to the appropriate solder balls.

According some embodiments of the present invention, vias that conduct noisy signals in a connector (e.g., a package) are placed next to vias that provide quiet return paths for the noisy signals to reduce cross-talk. For example, vias that conduct input and output signals in a connector can be placed next to vias that conduct ground signals, power supply signals, or both. According to other embodiments of the present invention, vias that conduct power supply signals in a connector (e.g., a package) are placed next to vias that provide quiet return paths (e.g., ground) to reduce impedance. The techniques of the present invention save valuable floor space, while causing no negative impact on critical return path vias.

FIGS. 2A-2F, 3, and 4 illustrate specific examples of via configurations that embody the principles of the present invention. The specific via configurations in the Figures are shown and described herein for purposes of illustration. They are not intended to limit the present invention to these specific examples. The present invention also includes other via configurations that optimize the placement of return loop vias according to the techniques described herein.

Many via configurations of the present invention can be visualized through a horizontal cross section 125 of core layer 135. FIGS. 2A-2F, 3, and 4 illustrate via configurations of the present invention that are shown from the perspective of cross section 125 in core layer 135. The small circles drawn with solid lines in FIGS. 2A-2F, 3 and 4 represent vias in the package.

The dotted lines and dotted circles shown in FIGS. 2A-2F do not represent any structural components of the vias or the package. The dotted lines and dotted circles are drawn merely to assist a viewer in understanding the spacing between the vias. Distance R indicates the radius of the dotted circles in FIGS. 2A-2F. The radii of the dotted circles can be the same value for each circle or a different value for some or all of the circles. According to one embodiment, the radius R of each dotted circle can also indicate the minimum spacing between vias that is required by a manufacturer of the package or other type of connector.

Figure 2A:
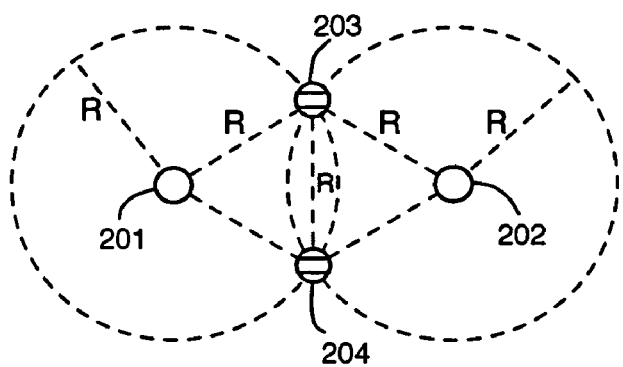
FIGS. 2A-2F illustrate six via configurations according to various embodiments of the present invention.

Referring to FIG. 2A, four vias 201-204 are shown. Vias 201 and 202 can route noisy signals such as input and output signals between two electrical units such as an IC and a PCB. Input and output (IO) signals are particularly noisy, because IO signals frequently toggle between high and low voltages. Therefore, adjacent IO vias are vulnerable to signal degradation due to cross-talk. IO signals can include, for example, data input signals, data output signals, control input signals, and control output signals.

Vias 203 and 204 route return path signals (e.g., ground, power supply, or both) for the IO signals (or other noisy signals) in vias 201-202. Vias 203 and 204 provide shielding that reduces the cross-talk between IO signals in vias 201 and 202. In the example of FIG. 2A, each via 201-202 is next to two return path vias 203 and 204, and each via 201-202 is spaced a distance R from each via 203-204. Also, vias 203-204 are spaced a distance R from each other. The radii R for the dotted circles shown in FIGS. 2A-2F may or may not have the same value. For example, the radius of the dotted circle around via 201 can be a different value than the radius of the dotted circle around via 202.

As another example, vias 201 and 202 can route power supply signals between the two electrical units. High impedance in power supply vias causes undesirable voltage drop that can significantly degrade circuit performance in an IC. Placing two return path vias 203 and 204 that route ground signals between power supply vias 201 and 202 reduces the impedance in the power supply vias, because the ground vias reduce the mutual capacitance and the mutual inductance between the power supply vias. According to another embodiment of the present invention, vias 201 and 202 can route an IO signal and a power supply signal.

The IO vias in any of the embodiments of the present invention can use the ground vias, the power vias or both as return paths. The power supply vias can use the ground vias a return path. Two IO vias can, e.g., share a single ground via as a return path. Two power supply vias can also share a single ground via as a return path. For example, vias 201 and 202 can share via 203 as a return path. Alternatively or in addition, vias 201 and 202 can share via 204 as a return path.

In general, placing more ground vias next IO vias causes a greater reduction in the cross-talk between the IO signals. Also, placing more ground vias next to power supply vias causes a greater reduction in the power impedance. However, requiring a large number of vias increases the cost and complexity of manufacturing an IC package. Therefore, the techniques of the present invention balance the desirability of placing additional return path vias with the added cost and complexity of creating a package with a large number of vias.

Figure 2B:
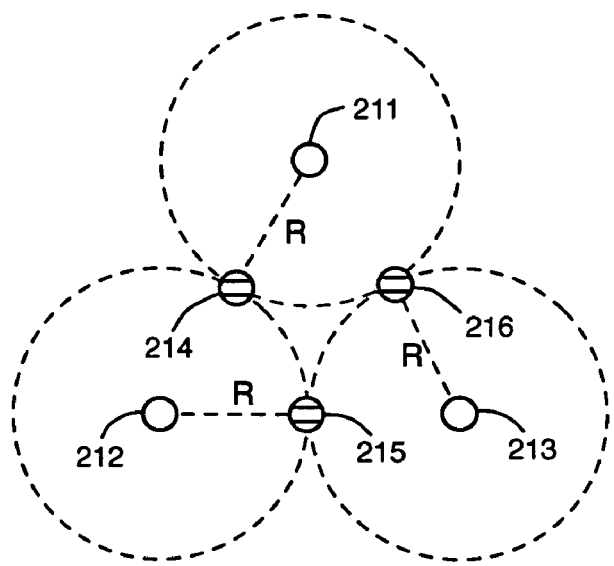

FIG. 2B illustrates another example of a via configuration of the present invention. The via configuration of FIG. 2B includes six vias 211-216. Vias 211-213 route signals such as IO signals and/or power supply signals. Vias 211-213 can route all IO signals, all power supply signals, or any combination of these two types of signals. Vias 214-216 route return path signals for vias 211-213, such as ground signals, power supply signals, or both. However, vias 214-216 are preferably ground vias.

Each via 211-213 is next to two return path vias, and each via 211-213 is a distance R from each of the two adjacent return path vias. For example, via 211 is next to vias 214 and 216 and a distance R from these two vias. The via configurations shown in FIGS. 2A-2F reduce cross-talk (for IO signals) and impedance (for power supply signals).

Figure 2C:
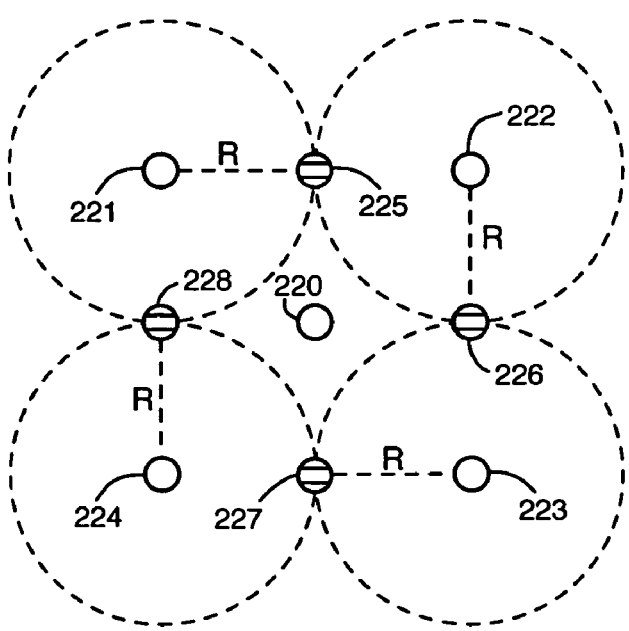

FIG. 2C illustrates yet another example of a via configuration of the present invention. The via configuration of FIG. 2C includes vias 220-228. Vias 220-224 route signal such as IO signals, power supply signals, or any combination of these signals. Vias 225-228 route return path signals for vias 220-224, such as ground signals, power supply signals, or both. Each of the vias 221-224 is next to two of the return path vias, and each via 221-224 is a distance R from each of the two adjacent return path vias. Via 220 is surrounded by 4 return path vias 225-228.

As an example, vias 221-224 can route IO signals, via 220 can route a power supply signal, and vias 225-228 can route ground signals. In this example, power via 220 is next to 4 ground vias 225-228, and each IO via 221-224 is next to two ground vias. For example, IO via 221 is next to ground vias 225 and 228. As another example, vias 220-224 all route power supply signals, and vias 225-228 route ground signals. In this second example, each of the power supply vias 221-224 is next to 2 ground vias.

Figure 2D:
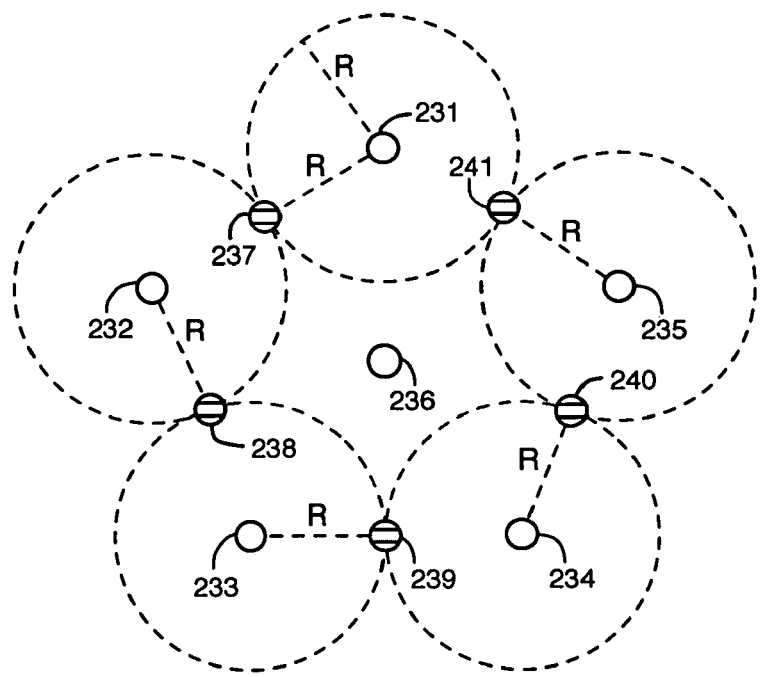

FIG. 2D illustrates yet another example of a via configuration of the present invention. The via configuration of FIG. 2D includes vias 231-241. Vias 231-236 route signals such as IO signals, power supply signals, or any combination of these signals. Vias 237-241 route return path signals for vias 231-

236, such as ground vias, power supply signals, or both. Each of the vias 231-235 is next to two of the return path vias, and each via 231-235 is a distance R from each of the two adjacent return path vias. Via 236 is surrounded by 5 return path vias 237-241.

As an example, vias 231-235 can route IO signals, via 236 can route a power supply signal, and vias 237-241 can route ground signals. In this example, power supply via 236 is next to the 5 ground vias 237-241, and each IO via 231-235 is next to two of the ground vias. For example, IO via 231 is next to ground vias 237 and 241 and is a distance R from each of them. As another example, vias 231-236 can all route power supply signals, while the remaining vias 237-241 route ground signals. In this second example, each of the power supply vias 231-235 is next to two ground vias.

Figure 2E:
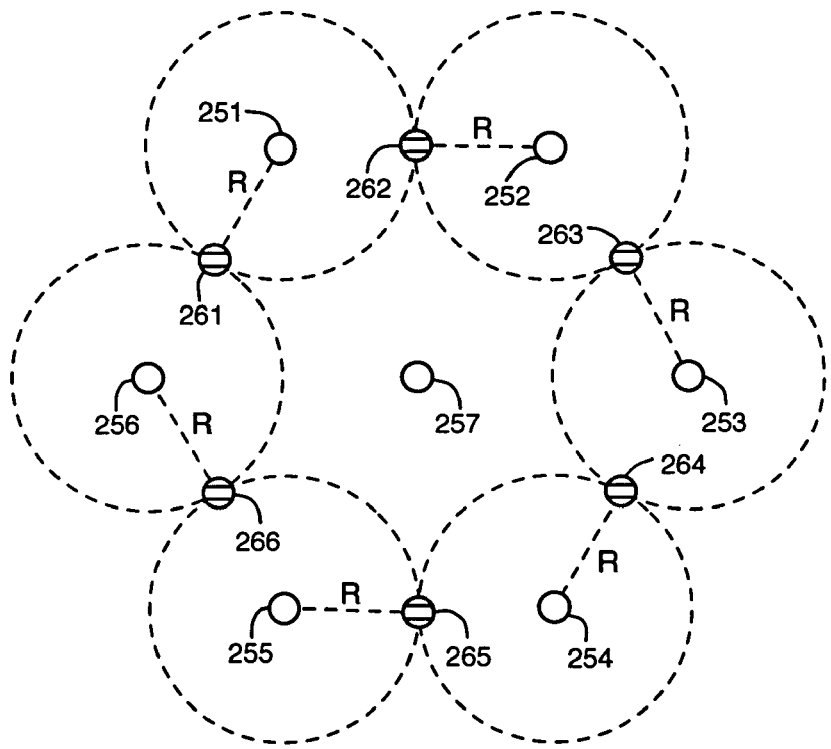

FIG. 2E illustrates yet another example of a via configuration of the present invention. The via configuration of FIG. 2E includes vias 251-257 and vias 261-266. Vias 251-257 route signals such as IO signals, power supply signals, or any combination of these signals. Vias 261-266 route return path signals for vias 251-257, such as ground signals, power supply signals, or both. Each of the vias 251-256 is next to two of the return path vias, and each via 251-256 is a distance R from each of the two adjacent return path vias. Via 257 is surrounded by 6 return path vias 261-266.

As an example, vias 251-256 can route IO signals, via 257 can route a power supply signal, and vias 261-266 can route ground signals. In this example, each IO via 251-256 is next to two ground vias, and power supply via 257 is next to 6 ground vias. For example, IO via 251 is next to ground vias 261 and 262 and is a distance R from each of them. As another example, vias 251-257 can all route power supply signals, while the remaining vias 261-266 route ground signals. In this second example, each of the power supply vias 251-256 is next to two ground vias.

Figure 2F:
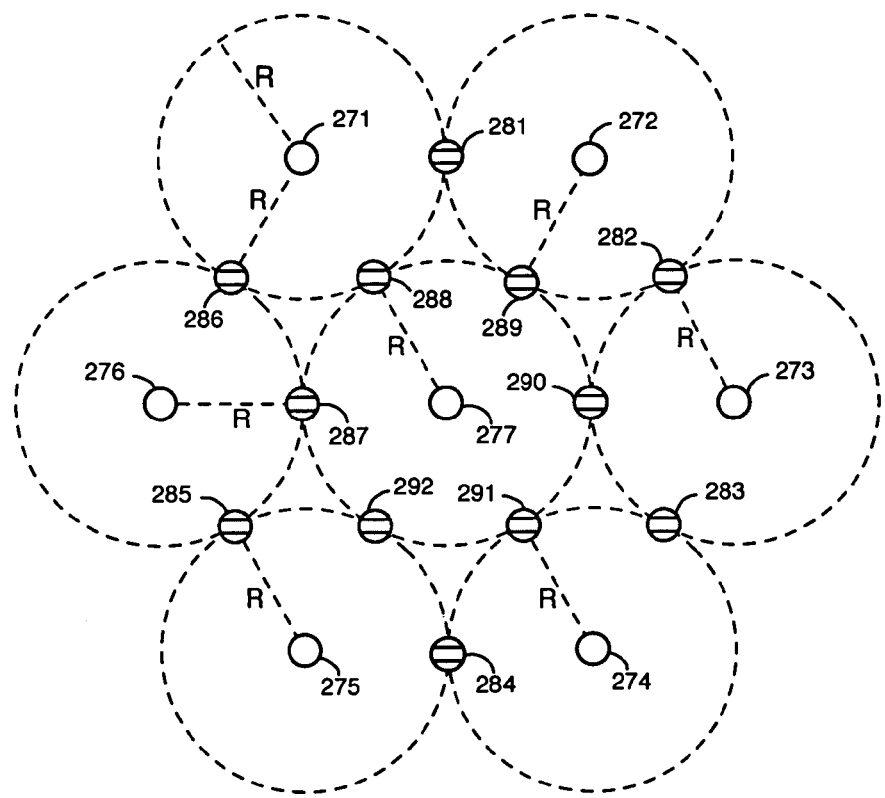

FIG. 2F illustrates still another example of a via configuration of the present invention. The via configuration of FIG. 2F includes vias 271-277 and vias 281-292. Noisy vias 271-277 route signals such as IO signals, power supply signals, or any combination of these signals. Vias 281-292 route return path signals for vias 271-277, such as ground signals, power supply signals, or both. Each of the vias 271-276 is next to three of the return path vias, and each via 271-276 is a distance R from the three adjacent return path vias. Via 277 is surrounded by 6 return path vias 287-292.

As an example, vias 271-276 can route IO signals, via 277 can route a power supply signal, and vias 281-292 can route ground signals. Each IO via 271-276 is next to three ground vias. For example, IO via 271 is next to ground vias 281, 286, and 288, and is a distance R from each of them. Power supply via 277 is surrounded by 6 ground vias 287-292 that are located within a distance R from via 277. Via 277 is surrounded by 12 ground vias 281-292 within a distance 2R. As another example, vias 271-277 can all route power supply signals, while vias 281-292 route ground signals. In this second example, each of the power supply vias 271-276 is next to three ground vias.

According to further embodiments of the present invention, central vias 220, 236, 257, and 277 in FIGS. 2C-2F, respectively, are IO vias that route time critical IO signals. These central vias are ideal for transmitting time critical IO signals, because they are surrounded by a large number of ground vias, and therefore, they can provide more shielding against cross-talk from nearby noisy vias. In particular, central via 277 in FIG. 2F provides the most shielding of the above described embodiments, because it is surrounded by the largest number of ground vias. If the minimum manufac-turable design rule is used to place these ground vias, via 277 can be considered "completely shielded" by the ground vias, just like the central wires in a coaxial cable.

Figure 3:
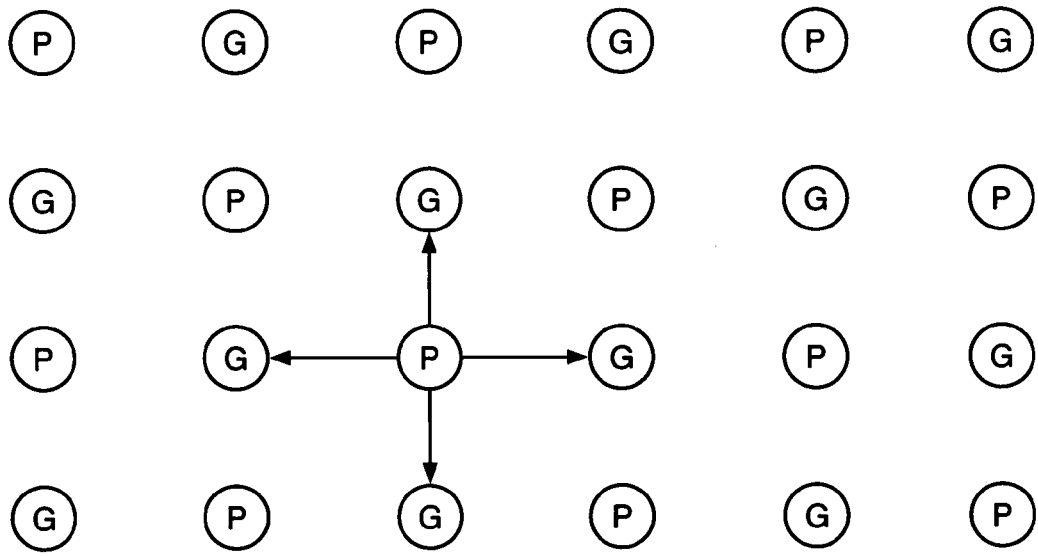
FIG. 3 illustrates a power-ground via configuration according to another embodiment of the present invention.

FIG. 3 illustrates still another example of a via configuration of the present invention. The via configuration of FIG. 3 includes an alternating array of power supply vias and ground vias. The power supply vias are represented by the circles labeled "P," and the ground vias are represented by the circles labeled "G." Each power supply via P is next to four ground vias G. Placing 4 ground vias next to each power supply via as shown in FIG. 3 reduces the impedance in the power supply vias relative to prior art techniques that have less ground vias next to each power via. The P and G vias are preferably separated by the minimum design rule distance. However, the P and G vias can be spaced apart by any suitable distance. The ground vias act as return paths for the power supply vias in the embodiment of FIG. 3.

The total ground-to-power via ratio is 1:1 in the embodiment of FIG. 3. Because the ground-to-power pattern is optimal, the embodiment of FIG. 3 provides a cost effective power grid via configuration that does not require a large number of extra vias. According to another embodiment, any or all of the vias in FIG. 3 that route a power supply signal can instead route an input or output signal.

Figure 4:
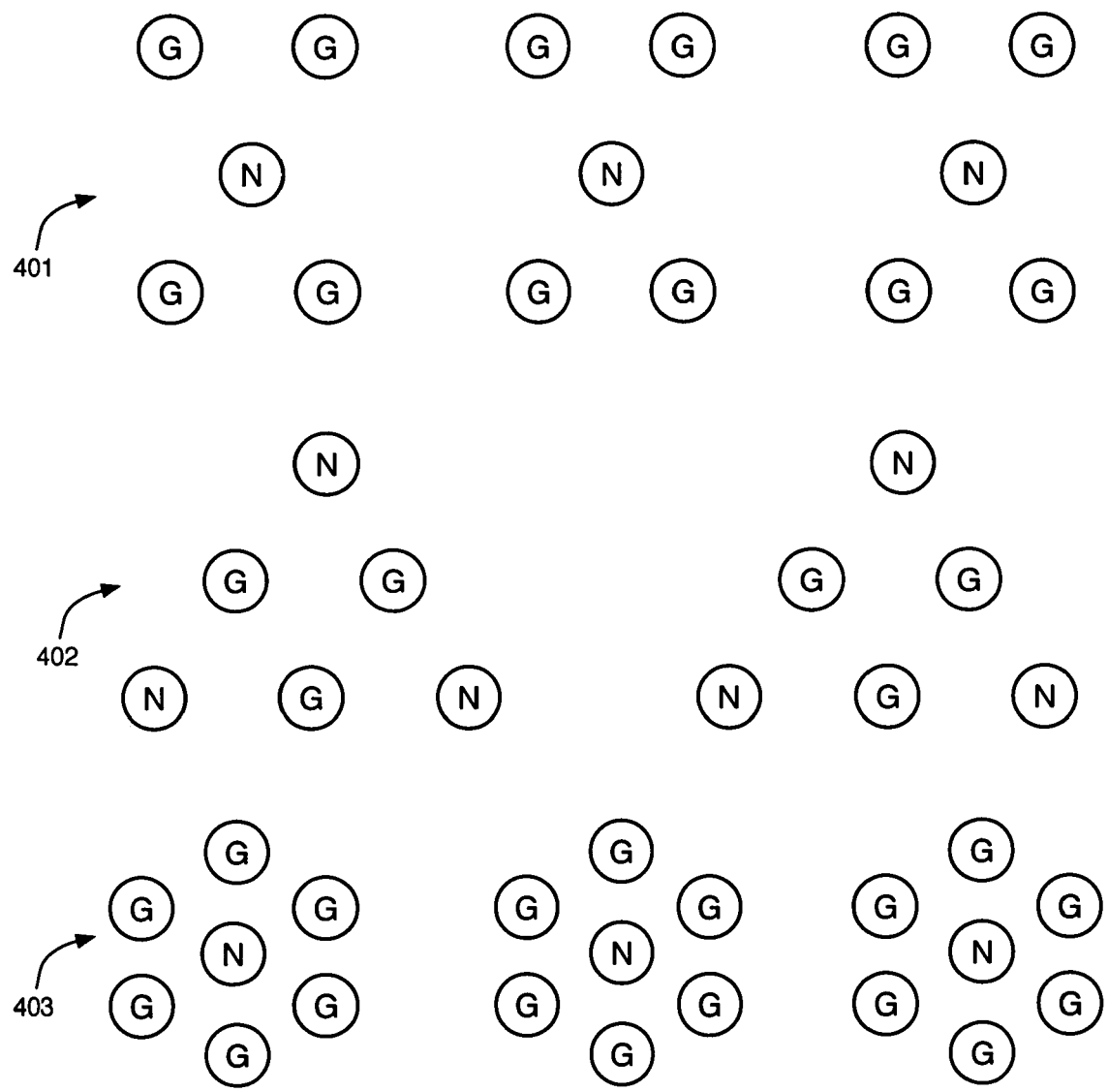
FIG. 4 illustrates a combination of via configurations according to a further embodiment of the present invention.

FIG. 4 illustrates a combination of via configurations according to another embodiment of the present invention. The embodiment of FIG. 4 combines three different vias configurations 401, 402, and 403 in the same package (or other connector). The embodiment of FIG. 4 demonstrates that multiple via configurations can be placed onto the same package.

In each of the via configurations 401, a via "N" is surrounded by 4 ground vias "G." In each of the via configurations 402, each via "N" is next to two ground vias "G." In each of the via configurations 403, a via "N" is surrounded by 6 ground vias "G." The "N" vias can route, for example, power supply signals, IO signals, or other noisy signals. The ground vias provide the return paths for the signals routed through the "N" vias in FIG. 4. Via configurations 403 are ideal for time critical IO signals that require very low cross-talk to achieve high performance and power supply signals that require low impedance.

According to further embodiments of the present invention, any two or more of the via configurations described herein and illustrated in the Figures can be combined in the same package. According to yet another embodiment, any one or more of the via configurations described herein can be used in a backplane. A backplane is a circuit board that connects electronic devices, cards, or other circuit boards together. A backplane can contain sockets for connecting electronic devices together and circuitry for performing logic functions. As an example, a backplane can be used to connect several PCB cards together to form a computer bus. A motherboard in a PC is often referred to as a backplane.

Via configurations of the present invention reduce cost and increase yield, because they are independent (or weakly dependent) on the thickness of the core layer in a package. Via configurations of the present invention are modular, because they can be duplicated throughout a package, while preserving the features and the performance of each via configuration. Because via configurations of the present invention are modular, the time and effort required to design and place a via layout can be reduced significantly.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A connector for connecting a first electrical unit to a second electrical unit, the connector comprising:
   first vias through the connector that are configured to route signals between the first and the second electrical units; and
   second vias through the connector that are configured to provide return paths for the signals,
   wherein each of the first vias is located the same distance from the two closest of the second vias.

2. The connector defined in claim 1 wherein two of the first vias share one of the second vias as a return path.

3. The connector defined in claim 1 wherein the first electrical unit is an integrated circuit, the second electrical unit is a circuit board, and the connector is part of a package that houses the integrated circuit.

4. The connector defined in claim 1 wherein a subset of the first vias are configured to route input and output signals, and the second vias are configured to route ground signals.

5. The connector defined in claim 1 wherein a subset of the first vias are configured to route power supply signals, and the second vias are configured to route ground signals.

6. The connector defined in claim 1 further comprising a third via configured to route one of the signals between the first and the second electrical units, wherein the third via is surrounded by at least four of the second vias.

7. The connector defined in claim 6 wherein the third via is surrounded by at least five of the second vias.

8. The connector defined in claim 7 wherein the third via is surrounded by at least six of the second vias.

9. The connector defined in claim 1 wherein each of the first vias is located the same distance from at least three of the closest second vias.

10. The connector defined in claim 1 further comprising:
    a central via through the connector that is configured to route a noisy signal between the first and the second electrical units,
    wherein the central via is surrounded by at least four of the second vias.

11. The connector defined in claim 10 wherein the central via is surrounded by at least six of the second vias.

12. The connector defined in claim 1 wherein each of the first vias is located next to at least three of the second vias.

13. A connector for connecting a first electrical unit to a second electrical unit, the connector comprising:
    first vias configured to route signals through the connector between the first and the second electrical units; and
    second vias configured to provide return paths for the signals through the connector,
    wherein the first and the second vias are arranged into rows and columns, each subsequent via in each of the rows alternates between the first and the second vias, and each subsequent via in each of the columns alternates between the first and the second vias.

14. The connector defined in claim 13 wherein the first vias are configured to route input and output signals, and the second vias are configured to route ground signals.

15. The connector defined in claim 13 wherein the first vias are configured to route power supply signals, and the second vias are configured to route ground signals.

16. The connector defined in claim 13 wherein at least two of the first vias share one of the second vias as a return path.

17. A connector for connecting a first electrical unit to a second electrical unit, the connector comprising:
    first vias through the connector that are configured to route signals between the first and the second electrical units; and
    second vias through the connector that are configured to provide return paths for the signals, wherein the first vias comprise a central via that is surrounded by at least four of the second vias, and the at least four of the second vias are the closest vias to the central via.

18. The connector defined in claim 17 wherein the central via is surrounded by at least five of the second vias, and the at least five of the second vias are the closest vias to the central via.

19. The connector defined in claim 17 wherein the central via is surrounded by at least six of the second vias, and the at least six of the second vias are the closest vias to the central via.

20. The connector defined in claim 17 wherein the central via is surrounded by at least six of the second vias, and at least six of the first vias are located the same distance from the two closest second vias.

21. The connector defined in claim 20 wherein the central via is located the same distance from each of the at least six of the second vias.

22. The connector defined in claim 17 wherein at least four of the first vias are located the same distance from the two closest second vias.

23. The connector defined in claim 17 wherein at least five of the first vias are located the same distance from the two closest second vias.

24. The connector defined in claim 17 wherein at least six of the first vias are located the same distance from the two closest second vias.

* * * * *